US012575194B2

(12) United States Patent
Tao et al.

(10) Patent No.: US 12,575,194 B2
(45) Date of Patent: Mar. 10, 2026

(54) PHOTOVOLTAIC MODULE AND METHOD FOR MANUFACTURING PHOTOVOLTAIC MODULE

(71) Applicants: JINKO SOLAR (HAINING) CO., LTD., Jiaxing City (CN); ZHEJIANG JINKO SOLAR CO., LTD., Zhejiang (CN); JINKO SOLAR CO., LTD., Jiangxi (CN)

(72) Inventors: Wusong Tao, Jiaxing City (CN); Zhendong Chen, Jiaxing City (CN); Junhui Liu, Jiaxing City (CN)

(73) Assignees: JINKO SOLAR (HAINING) CO., LTD., Jiaxing City (CN); ZHEJIANG JINKO SOLAR CO., LTD., Haining (CN); JINKO SOLAR CO., LTD., Jiangxi (CN)

( * ) Notice: Subject to any disclaimer, the term of this patent is extended or adjusted under 35 U.S.C. 154(b) by 10 days.

(21) Appl. No.: 18/415,546

(22) Filed: Jan. 17, 2024

(65) Prior Publication Data

US 2024/0154050 A1      May 9, 2024

Related U.S. Application Data

(63) Continuation of application No. 18/065,608, filed on Dec. 13, 2022, now Pat. No. 11,955,573.

(30) Foreign Application Priority Data

Jan. 21, 2022    (CN) .......................... 202210072955.2

(51) Int. Cl.
H10F 19/80          (2025.01)
H10F 71/00          (2025.01)

(52) U.S. Cl.
CPC ............. *H10F 19/80* (2025.01); *H10F 71/00* (2025.01)

(58) Field of Classification Search
CPC ................................. H10F 19/80; H10F 71/00
See application file for complete search history.

(56) References Cited

U.S. PATENT DOCUMENTS 5,252,141 A      10/1993  Inoue et al.
5,733,382 A  *   3/1998  Hanoka ............. B32B 17/10302
                                                  156/286

(Continued)

FOREIGN PATENT DOCUMENTS

CN          201535679 U       7/2010
CN          104795465 A       7/2015

(Continued)

OTHER PUBLICATIONS

WO 2013/136507 A1 English Translated provided by FIT database, translated on Sep. 6, 2025.*

(Continued)

*Primary Examiner* — Golam Mowla
(74) *Attorney, Agent, or Firm* — USCH Law, PC

(57)                    ABSTRACT

A photovoltaic module and a method for manufacturing the same are provided. The photovoltaic module includes a plurality of cell strings; a first encapsulating adhesive film and a second encapsulating adhesive film, where the photovoltaic module has a central region and a peripheral region, where the first encapsulating adhesive film defines at least one first hole and the second encapsulating adhesive film defines at least one second hole, and each first hole directly faces a corresponding second hole; and at least one filling structure, where the at least one filling structure includes a material having a crosslinking curing speed that is faster than a crosslinking curing speed of a material in the first encapsulating adhesive film and is faster than a cross- (Continued)

linking curing speed of a material in the second encapsulating adhesive film.

15 Claims, 7 Drawing Sheets

(56) References Cited

U.S. PATENT DOCUMENTS

| | | | |
|---|---|---|---|
| 9,299,875 | B2 | 3/2016 | Furihata et al. |
| 2005/0115603 | A1* | 6/2005 | Yoshida ................. H10F 19/80 |
| | | | 136/251 |
| 2014/0000683 | A1 | 1/2014 | Pretorius et al. |

FOREIGN PATENT DOCUMENTS

| | | | |
|---|---|---|---|
| CN | 108231932 | A | 6/2018 |
| CN | 209119137 | U | 7/2019 |
| CN | 209607752 | U | 11/2019 |
| CN | 210575975 | U | 5/2020 |
| CN | 211455699 | U | 9/2020 |
| CN | 111732901 | A | 10/2020 |
| CN | 111763481 | A | 10/2020 |
| CN | 112737489 | A | 4/2021 |
| CN | 212934631 | U | 4/2021 |
| CN | 213425001 | U | 6/2021 |
| CN | 213461648 | U | 6/2021 |
| JP | H06196740 | A | 7/1994 |
| WO | 2013136507 | A1 | 9/2013 |
| WO | 2020052695 | A2 | 3/2020 |
| WO | 2021227283 | A1 | 11/2021 |
| WO | 2022012125 | A1 | 1/2022 |

OTHER PUBLICATIONS

Jinko Solar (Haining) Co., Ltd., et al., Extended European Searh Report, EP 24163743.8, Jul. 9, 2024, 7 pgs.
Jinko Solar (Haining) Co., Ltd., et al., Notice of Allowance, U.S. Appl. No. 18/065,608, Dec. 12, 2023, 19 pgs.
Jinko Solar (Haining) Co., Ltd., et al., Extended European Search Report, EP 22214648.2, Jun. 20, 2023, 7 pgs.

* cited by examiner

PHOTOVOLTAIC MODULE AND METHOD FOR MANUFACTURING PHOTOVOLTAIC MODULE

CROSS REFERENCE TO RELATED APPLICATIONS

The present application is a continuation of U.S. patent application Ser. No. 18/065,608, filed on Dec. 13, 2022, which claims the benefit of priority to Chinese Patent Application No. 202210072955.2 filed on Jan. 21, 2022, each of which is incorporated herein by reference in its entirety.

TECHNICAL FIELD

The disclosure relates to the field of solar energy, and more particularly to a photovoltaic module and a method for manufacturing the photovoltaic module.

BACKGROUND

Adhesive films for photovoltaic module encapsulating are important parts of solar photovoltaic modules. The adhesive film is disposed between a piece of glass and solar cells or between the solar cells and a back plate, which can seal, insulate, and protect the solar cells, thereby improving long-term stability of the module.

However, some defects exist in an encapsulating structure of the solar photovoltaic module in use. For example, glue separation easily occurs between the packaging structure and the solar cells or cell strings, which may lead to poor stability of the solar photovoltaic module, thereby affecting normal use of the solar photovoltaic module. In addition, during encapsulating of the solar cells or the cell strings, the solar cell or the cell string cannot be rapidly positioned, and rapid encapsulating of the solar cells or the cell strings cannot be achieved, which makes encapsulating of the solar photovoltaic module more time-consuming and labor-intensive, increases labor intensity during encapsulating, and affects encapsulating efficiency of the solar photovoltaic module.

SUMMARY

Embodiments of the disclosure provide a photovoltaic module and a method for manufacturing the photovoltaic module.

According to some embodiments, a photovoltaic module is provided. The photovoltaic module includes a plurality of cell strings; a first encapsulating adhesive film and a second encapsulating adhesive film that are stacked, where there is a gap between the first encapsulating adhesive film and the second encapsulating adhesive film for accommodating the plurality of cell strings; where the photovoltaic module has a central region and a peripheral region surrounding the central region, and the plurality of cell strings are disposed in the central region, where the first encapsulating adhesive film defines at least one first hole in the peripheral region, the second encapsulating adhesive film defines at least one second hole in the peripheral region, and each first hole is aligned with a corresponding second hole of the at least one second hole, where the at least one first hole and the at least one second hole include one or more through holes; and at least one filling structure, where each filling structure of the at least one filling structure fills a respective first hole and a respective second hole, where the at least one filling structure includes a material having a crosslinking curing speed that is faster than a crosslinking curing speed of a material in the first encapsulating adhesive film and is faster than a crosslinking curing speed of a material in the second encapsulating adhesive film.

In some embodiments, in a direction from the first encapsulating adhesive film to the second encapsulating adhesive film, and a ratio of a thickness of the each filling structure to a sum of a depth of the respective first hole and a depth of the respective second hole is 1:0.8 to 1:1.2.

In some embodiments, the at least one filling structure includes polyolefin elastomer (POE) of which a crosslinking curing speed is faster than a crosslinking curing speed of POE from which the first encapsulating adhesive film and in the second encapsulating adhesive film.

In some embodiments, each of at least one of a side of the first encapsulating adhesive film away from the gap and a side of the second encapsulating adhesive film away from the gap is provided with at least one protrusion structure, where an orthographic projection of each protrusion structure of the at least one protrusion structure on the first encapsulating adhesive film is located in an orthographic projection of a corresponding cell string on the first encapsulating adhesive film, or an orthographic projection of each protrusion structure on the second encapsulating adhesive film is located in an orthographic projection of a corresponding cell string on the second encapsulating adhesive film.

In some embodiments, the orthographic projection of each protrusion structure on the first encapsulating adhesive film is a first orthographic projection, and the orthographic projection of the corresponding cell string on the first encapsulating adhesive film is a second orthographic projection, where a ratio of an area of the first orthographic projection to an area of the second orthographic projection is 0.5 to 1.

In some embodiments, in a direction from the first encapsulating adhesive film to the second encapsulating adhesive film, a ratio of a thickness of each protrusion structure to a thickness of the first encapsulating adhesive film in the peripheral region is ⅓ to ⅐.

In some embodiments, the orthographic projection of each protrusion structure on the second encapsulating adhesive film is a third orthographic projection, and the orthographic projection of the corresponding cell string on the second encapsulating adhesive film is a fourth orthographic projection, where a ratio of an area of the third orthographic projection to an area of the fourth orthographic projection is 0.5 to 1.

In some embodiments, in a direction from the first encapsulating adhesive film to the second encapsulating adhesive film, a ratio of a thickness of each protrusion structure to a thickness of the second encapsulating adhesive film in the peripheral region is ⅓ to ⅐.

In some embodiments, each protrusion structure comprises a plurality of first protrusion blocks spaced apart from each other, and the plurality of first protrusion blocks are arranged in an extending direction of each of the plurality of cell strings.

In some embodiments, the at least one protrusion structure and the first encapsulating adhesive film are integrally formed or the at least one protrusion structure and the second encapsulating adhesive film are integrally formed.

In some embodiments, the photovoltaic module further includes: at least one second protrusion block, where the at least one second protrusion block is disposed on a side of one of the first encapsulating adhesive film and the second encapsulating adhesive film in the central region close to the gap, and each second protrusion block is disposed in a spacing between a corresponding pair of adjacent cell strings; and the photovoltaic module further defines at least one groove, where the at least one groove is defined on a side of an other of the first encapsulating adhesive film and the second encapsulating adhesive film in the central region close to the gap, and each second protrusion block is filled in a corresponding groove.

In some embodiments, in a direction perpendicular to a direction from the first encapsulating adhesive film to the second encapsulating adhesive film, a width of a region of a respective second protrusion block close to a corresponding groove is larger than a width of another region of the respective second protrusion block away from the corresponding groove; and a width of a region of a respective groove close to a corresponding pair of adjacent cell strings is smaller than a width of another region of the respective groove away from the corresponding pair of the adjacent cell strings.

In some embodiments, in the direction perpendicular to the direction from the first encapsulating adhesive film to the second encapsulating adhesive film, a ratio of the width of the region of the respective protrusion block close to a bottom of the corresponding groove to the width of the another region of the respective protrusion block away from the bottom of the corresponding groove is 0.5 to 1.

In some embodiments, in a direction from the first encapsulating adhesive film to the second encapsulating adhesive film, a difference between a thickness of each second protrusion block and a depth of the corresponding groove is not less than 0.13 mm.

In some embodiments, in a direction from the first encapsulating adhesive film to the second encapsulating adhesive film, a difference between a thickness of each protrusion block and a depth of the corresponding groove is not greater than 0.16 mm.

In some embodiments, the at least one second protrusion block and the first encapsulating adhesive film or the second encapsulating adhesive film are integrally formed.

According to some embodiments, a method for manufacturing a photovoltaic module is provided. The method is used for manufacturing the photovoltaic module of any embodiment of the disclosure. The method includes the following. A plurality of cell strings are provided. A first encapsulating adhesive film of any aspect is formed, where the first encapsulating adhesive film is disposed on a side of each of the plurality of cell strings. A second encapsulating adhesive film of any aspect is formed, where the second encapsulating adhesive film is disposed on an other side of each of the plurality of cell strings away from the first encapsulating adhesive film, where at least one first hole is defined on the first encapsulating adhesive film in the peripheral region, and at least one second hole is defined on the second encapsulating adhesive film in the peripheral region. The plurality of cell strings, the first encapsulating adhesive film, and the second encapsulating adhesive film are encapsulated, and at least one filling structure is formed during encapsulating, where each filling structure of the at least one filling structure is filled in a respective first hole and a respective second hole, where each filling structure of the at least one filling structure includes a material having a crosslinking curing speed that is faster than a crosslinking curing speed of a material in the first encapsulating adhesive film and is faster than a crosslinking curing speed of a material in the second encapsulating adhesive film.

In some embodiments, the first encapsulating adhesive film and the second encapsulating adhesive film are formed as follows. An initial first encapsulating adhesive film and an initial second encapsulating adhesive film are provided, where there is a gap between the initial first encapsulating adhesive film and the initial second encapsulating adhesive film for accommodating the plurality of cell strings. The initial first encapsulating adhesive film is placed on the side of each of the plurality of cell strings, and the initial second encapsulating adhesive film is placed on an other side of each of the plurality of cell strings away from the initial first encapsulating adhesive film. At least one hole is punched on the initial first encapsulating adhesive film in the peripheral region to define at least one first hole, and at least one hole is punched on the initial second encapsulating adhesive film in the peripheral region to define at least one second hole.

In some embodiments, the initial first encapsulating adhesive film and the initial second encapsulating adhesive film are formed by a roller pressure molding process. Each of at least one of a side of the initial first encapsulating adhesive film away from the gap and a side of the initial second encapsulating adhesive film away from the gap is provided with at least one protrusion structure, and an orthographic projection of each protrusion structure on the initial first encapsulating adhesive film is located in an orthographic projection of a corresponding cell string on the initial first encapsulating adhesive film, or an orthographic projection of each protrusion structure on the initial second encapsulating adhesive film is located in an orthographic projection of a corresponding cell string on the initial second encapsulating adhesive film.

BRIEF DESCRIPTION OF THE DRAWINGS

One or more embodiments are described as examples with reference to the corresponding figures in the accompanying drawings and the exemplary illustration does not constitute a limitation to the embodiments. Elements with same reference numerals in the figures are represented as similar elements. Unless otherwise stated, the figures in the accompanying drawings do not constitute a proportion limitation.

DETAILED DESCRIPTION OF THE EMBODIMENTS

In view of the above, yield and stability of photovoltaic modules need to be improved.

Embodiments of the disclosure provide a photovoltaic module and a method for manufacturing the photovoltaic module. During laminating, before a first encapsulating adhesive film and a second encapsulating adhesive film are solidified and shaped under the action of pressure, a filling structure has been solidified and formed. In this way, it is possible to realize positioning between the first encapsulating adhesive film and the second encapsulating adhesive film through cooperation between the at least one filling structure and at least one first hole and at least one second hole. Furthermore, it is beneficial to prevent relative slip between the first encapsulating adhesive film and the second encapsulating adhesive film through the solidified and shaped filling structure, and further avoid slip of cell strings due to the relative slip between the first encapsulating adhesive film and the second encapsulating adhesive film, thereby avoiding stacking of cell strings and improving the yield and stability of photovoltaic modules. In addition, after the laminating, when adhesion between the first encapsulating adhesive film and the second encapsulating adhesive film is not good, a relative movement between the first encapsulating adhesive film and the second encapsulating adhesive film can be avoided with aid of the cooperation relationship between the at least one filling structure and the at least one first hole and the at least one second hole, thereby further improving the stability and service life of the photovoltaic module.

Various embodiments of the disclosure will be described in detail below with reference to the accompanying drawings. However, those of ordinary skill in the art should appreciate that many technical details have been proposed in various embodiments of the disclosure for better understanding of the disclosure. The technical solutions in the disclosure are able to be realized even without these technical details as well as various changes and modifications based on the following embodiments.

Figure 11:
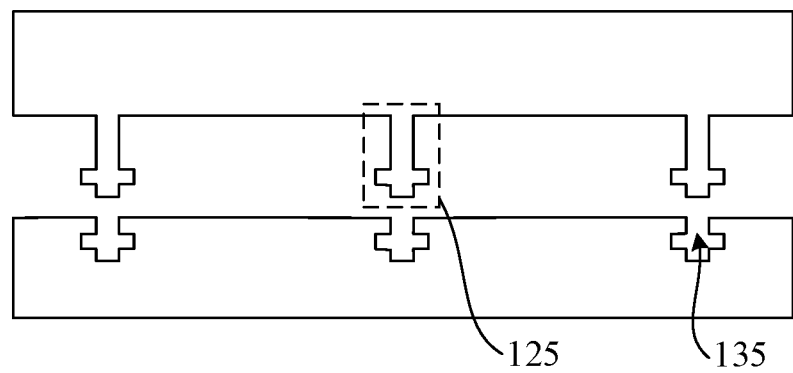
FIG. 11 is a schematic cross-sectional structural view of the first encapsulating adhesive film and the second encapsulating adhesive film in the photovoltaic module provided in FIG. 10.

Embodiments of the disclosure provide a photovoltaic module, which may be described in detail below with reference to the accompanying drawings. FIGS. 1, 4, 5, 7, 8, 10, 12, and 13 are eight schematic cross-sectional structural views of a photovoltaic module according to embodiments of the disclosure. FIG. 2 is a schematic cross-sectional structural view of a first encapsulating adhesive film and a second encapsulating adhesive film in the photovoltaic module in FIG. 1. FIG. 3 is a schematic top view of the first encapsulating adhesive film or the second encapsulating adhesive film in the photovoltaic module provided in FIG. 1. FIG. 6 is a schematic top view of the first encapsulating adhesive film or the second encapsulating adhesive film in the photovoltaic module provided in FIG. 5. FIG. 9 is a schematic cross-sectional structural view of the first encapsulating adhesive film and the second encapsulating adhesive film in the photovoltaic module provided in FIG. 8. FIG. 11 is a schematic cross-sectional structural view of the first encapsulating adhesive film and the second encapsulating adhesive film in the photovoltaic module provided in FIG. 10.

Figure 1:
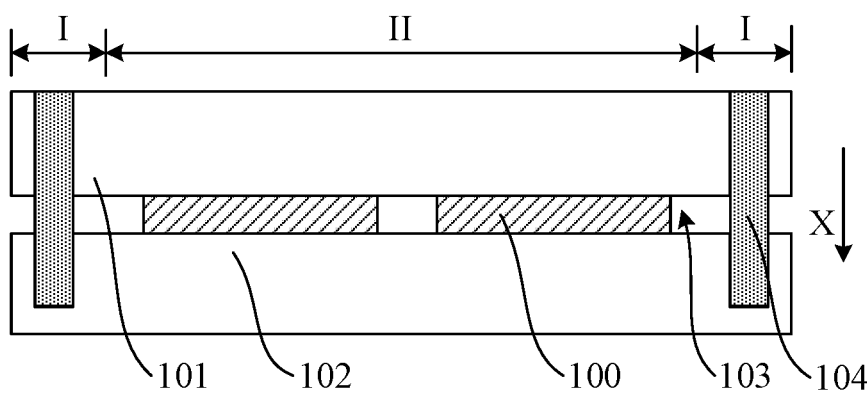
FIGS. 1, 4, 5, 7, 8, 10, 12, and 13 are eight schematic cross-sectional structural views of a photovoltaic module according to embodiments of the disclosure.
Figure 2:
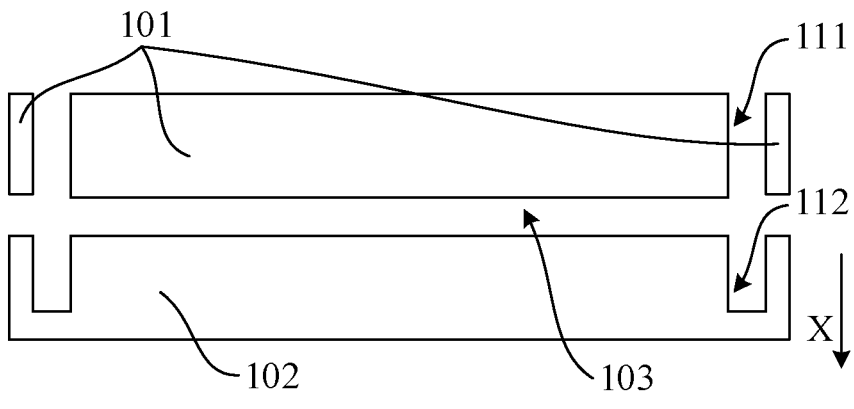
FIG. 2 is a schematic cross-sectional structural view of a first encapsulating adhesive film and a second encapsulating adhesive film in the photovoltaic module in FIG. 1.
Figure 3:
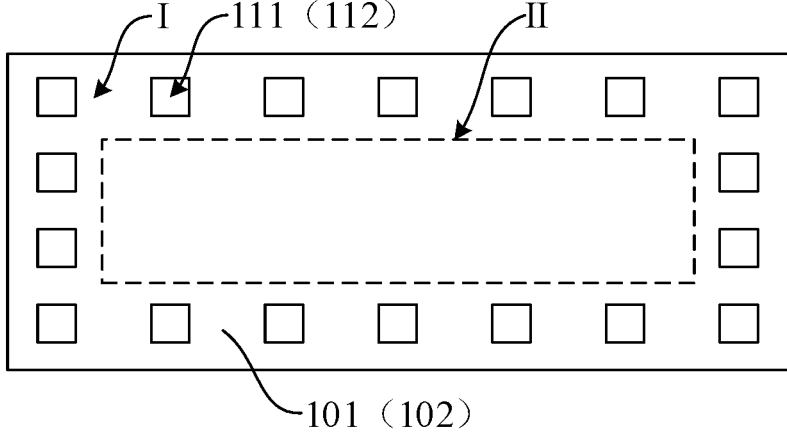
FIG. 3 is a schematic top view of the first encapsulating adhesive film or the second encapsulating adhesive film in the photovoltaic module provided in FIG. 1.

Referring to FIGS. 1 to 3, the photovoltaic module includes: a plurality of cell strings 100; a first encapsulating adhesive film 101 and a second encapsulating adhesive film 102 that are stacked; and at least one filling structure 104. There is a gap 103 between the first encapsulating adhesive film 101 and the second encapsulating adhesive film 102 for accommodating the plurality of cell strings 100. The photovoltaic module has a central region II and a peripheral region I surrounding the central region II. The plurality of cell strings 100 are disposed in the central region II. At least one first hole 111 is defined on the first encapsulating adhesive film 101 in the peripheral region I, and at least one second hole 112 is defined on the second encapsulating adhesive film 102 in the peripheral region I. Each first hole 111 directly faces a corresponding second hole 112, and the at least one first hole 111 and the at least one second hole 112 includes one or more through holes. The at least one filling structure 104 are respectively filled in the at least one first hole 111 and the at least one second hole 112. A crosslinking curing speed of a material in the at least one filling structure 104 is faster than a crosslinking curing speed of a material in the first encapsulating adhesive film 101, and the crosslinking curing speed of the material in the at least one filling structure 104 is also faster than a crosslinking curing speed of a material in the second encapsulating adhesive film 102.

Therefore, during lamination, before the first encapsulating adhesive film 101 and the second encapsulating adhesive film 102 are gradually solidified and shaped under the action of pressure, the filling structure 104 has been solidified and formed. In this way, it is beneficial to realize positioning between the first encapsulating adhesive film 101 and the second encapsulating adhesive film 102 through cooperation between the filling structure 104 and the first hole 111 and the second hole 112. On the other hand, it is advantageous to avoid relative slip between the first encapsulating adhesive film 101 and the second encapsulating adhesive film 102 by utilizing the solidified filling structure 104, and further avoid slip of a plurality of cell strings 100 due to the relative slip between the first encapsulating adhesive film 101 and the second encapsulating adhesive film 102, thereby avoiding stacking of cell strings and improving the yield and stability of photovoltaic modules.

In FIGS. 1 to 3, each first hole 111 is a through hole and each second hole 112 is a blind hole. In specific examples, each first hole 111 may be a blind hole and each second hole 112 may be a through hole. Alternatively, the at least one first hole 111 and the at least one second hole 112 are all through holes. In addition, in FIG. 1, each filling structure 104 is fully filled in the corresponding first hole 111 and the corresponding second hole 112. It can be understood that the filling structure 104 only needs to be partially filled in the first hole 111 and the second hole 112, and the filling structure 104 needs to be filled in the gap 103 in FIG. 1, which mean that a thickness of the filling structure 104 is smaller than a filling depth of the first hole and the second hole, and the filling structure 104 is also filled in the gap 103.

In some embodiments, referring to FIGS. 1 and 2, in a direction X from the first encapsulating adhesive film 101 to the second encapsulating adhesive film 102, a sum of a depth of each first hole 111 and a depth of the corresponding second hole 112 is deemed as a filling depth, and a ratio of a thickness of a corresponding filling structure 104 to the filling depth is in a range of 1:0.8 to 1:1.2. In this way, it is possible to prevent relative slip between the first encapsulating adhesive film 101 and the second encapsulating adhesive film 102 through cooperation between the filling structure 104 and the first hole 111 and the second hole 112, and further avoid a volume of the filling structure 104 too large to avoid unnecessary increase in the overall mass of the photovoltaic module.

In some embodiments, the filling structure 104 is made from a fast crosslinked polyolefin elastomer (POE), the first encapsulating adhesive film 101 is made from a conventional POE, and the second encapsulating adhesive film 102 is made from a conventional POE. That is, the at least one filling structure includes POE of which a crosslinking curing speed is faster than a crosslinking curing speed of POE in the first encapsulating adhesive film and in the second encapsulating adhesive film. In this way, during the lamination, a crosslinking curing speed of the fast crosslinked POE is faster than that of conventional POE. Therefore, it is ensured that the crosslinking curing speed in the material of the at least one filling structure 104 is faster than that of the material in the first encapsulating adhesive film 101, and the crosslinking curing speed of the material in the at least one filling structure 104 is also faster than that of the material in the second encapsulating adhesive film 102.

It is to be noted that in a top view illustrated in FIG. 3, each of the first hole 111 and the second hole 112 has a rectangular shape. There is no restriction on the specific shape of each of the first hole 111 and the second hole 112 in the top view. For example, in specific scenarios, in the top view, each of the first hole 111 and the second hole 112 may have a circular shape, a triangular shape, or a polygonal shape.

Figure 4:
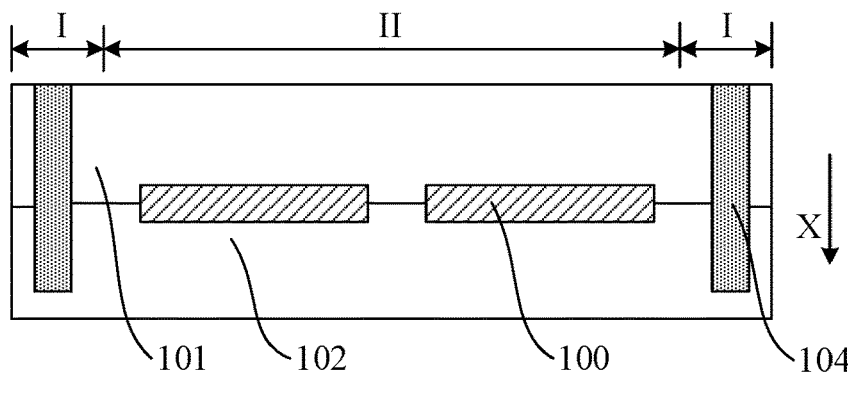

In some embodiments, referring to FIG. 4, during the lamination, in the direction X from the first encapsulating adhesive film 101 to the second encapsulating adhesive film 102, if the cell string 100 is relatively thin, the gap 103 between the first encapsulating adhesive film 101 and the second encapsulating adhesive film 102 for accommodating the plurality of cell strings 100 is also narrow. When the first encapsulating adhesive film 101 and the second encapsulating adhesive film 102 are in a fluid state under the action of pressure, a portion of the first encapsulating adhesive film 101 and/or a portion of the second encapsulating adhesive film 102 may be slightly flowed, such that a spacing between adjacent cell strings 100 is filled, and then the photovoltaic module illustrated in FIG. 4 may be formed. That is, after the lamination, a side of the first encapsulating adhesive film 101 facing the plurality of cell strings 100 and a side of the second encapsulating adhesive film 102 facing the plurality of cell strings 100 are attached to each other.

In FIG. 4, the filling structure 104 is fully filled in the first hole 111 and the second hole 112. In practical scenarios, the filling structure 104 only needs to be partially filled in the first hole 111 and the second hole 112, and the filling structure 104 is filled in the gap 103.

Figure 5:
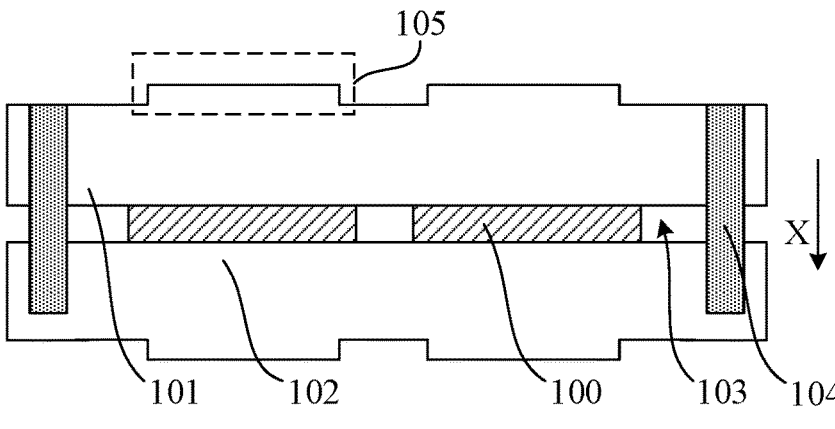
Figure 6:
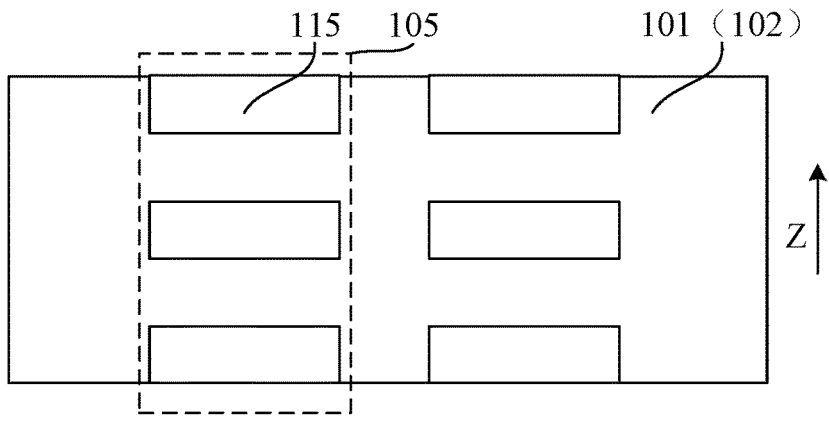
FIG. 6 is a schematic top view of the first encapsulating adhesive film or the second encapsulating adhesive film in the photovoltaic module provided in FIG. 5.

In some embodiments, referring to FIG. 5, each of at least one of a side of the first encapsulating adhesive film 101 away from the gap 103 and a side of the second encapsulating adhesive film 102 away from the gap 103 is provided with at least one protrusion structure 105. An orthographic projection of each of the at least one protrusion structure 105 on the first encapsulating adhesive film 101 is located in an orthographic projection of a corresponding cell string 100 on the first encapsulating adhesive film 101, or an orthographic projection of each of the at least one protrusion structure 105 on the second encapsulating adhesive film 102 is located in an orthographic projection of a corresponding cell string 100 on the second encapsulating adhesive film 102. As such, each protrusion structure 105 is directly facing (aligned with) the corresponding cell string 100. When the first encapsulating adhesive film 101 and/or the second encapsulating adhesive film 102 are pressed, compared with the spacing between the adjacent cell strings 100, each cell string 100 may be subjected to a greater pressure, which facilitates fixing each cell string 100 in a position directly facing a corresponding protrusion structure 105, and preventing each cell string 100 from slipping relative to the first encapsulating adhesive film 101 and/or the second encapsulating adhesive film 102, thereby further improving the yield and stability of the photovoltaic module.

In some embodiments, if the at least one protrusion structure 105 is located on the side of the first encapsulating adhesive film 101 away from the gap 103, the at least one protrusion structure 105 and the first encapsulating adhesive film 101 may be integrally formed. If the at least one protrusion structure 105 is located on the side of the second encapsulating adhesive film 102 away from the gap 103, the at least one protrusion structure 105 and the second encapsulating adhesive film 102 may be integrally formed. Therefore, a connection strength between the at least one protrusion structure 105 and the first encapsulating adhesive film 101 or the second encapsulating adhesive film 102 can be improved, and the relative slip between the at least one protrusion structure 105 and the first encapsulating adhesive film 101 or the second encapsulating adhesive film 102 can be avoided.

In FIG. 5, the side of the first encapsulating adhesive film 101 away from the gap 103 and the side of the second encapsulating adhesive film 102 away from the gap 103 each are provided with the at least one protrusion structure 105. However, in practical situations, only the side of the first encapsulating adhesive film 101 or the side of the second encapsulating adhesive film 102 away from the gap 103 may be provided with the at least one protrusion structure 105.

In some embodiments, the orthographic projection of each protrusion structure 105 on the first encapsulating adhesive film 101 is a first orthographic projection, and the orthographic projection of the corresponding cell string 100 on the first encapsulating adhesive film 101 is a second orthographic projection. A ratio of an area of the first orthographic projection to an area of the second orthographic projection is 0.5 to 1. Therefore, it is advantageous to avoid excessive volume of the protrusion structure 105 while increasing the pressure applied on the cell string 100 by using the protrusion structure 105, such that unnecessary increase in the overall volume of the photovoltaic module can be avoided.

In some embodiments, the orthographic projection of each protrusion structure 105 on the second encapsulating adhesive film 102 is a third orthographic projection, and the orthographic projection of the corresponding cell string 100 on the second encapsulating adhesive film 102 is a fourth orthographic projection. A ratio of an area of the third orthographic projection to an area of the fourth orthographic projection is 0.5 to 1. Therefore, it is advantageous to avoid excessive volume of the protrusion structure 105 while increasing the pressure applied on the cell string 100 by using the protrusion structure 105, such that unnecessary increase in the overall volume of the photovoltaic module can be avoided.

The first encapsulating adhesive film 101 and the second encapsulating adhesive film 102 may be directly faced to each other, i.e., an orthographic projection of the first encapsulating adhesive film 101 on the second encapsulating adhesive film 102 coincides with a surface of the second encapsulating adhesive film 102.

In some embodiments, with reference to FIG. 6, each protrusion structure 105 includes a plurality of first protrusion blocks 115 spaced apart from each other, and the plurality of first protrusion blocks 115 are arranged in an extending direction of each of the plurality of cell strings 100, so that it is beneficial to further reduce a volume of the first encapsulating adhesive film 101 as a whole or a volume of the second encapsulating adhesive film 102 as a whole when the pressure applied on the cell string 100 is increased by the protrusion structure 105, so as to further reduce the overall volume of the photovoltaic module. In practical situations, the protrusion structure 105 may be a whole piece of structure along an extending direction Z of the cell string 100. Alternatively, the protrusion structure 105 may include the plurality of first protrusion blocks 115 spaced apart from each other and arranged in an array.

In some embodiments, if the at least one protrusion structure 105 is disposed on the side of the first encapsulating adhesive film 101 away from the gap 103, in the direction X from the first encapsulating adhesive film 101 to the second encapsulating adhesive film 102, a ratio of a thickness of each protrusion structure 105 to a thickness of a part of the first encapsulating adhesive film 101 located in the peripheral region I is ⅓ to ⅐. Therefore, it is advantageous to control the overall mass of the protrusion structure 105 and the first encapsulating adhesive film 101 in an appropriate range while increasing the pressure applied on the cell string 100 by using the protrusion structure 105, so as to avoid unnecessary increase in the overall mass of the photovoltaic module.

In some embodiments, a gram weight of the first encapsulating adhesive film 101 may range from 300 g/m² to 550 g/m². In the direction X from the first encapsulating adhesive film 101 to the second encapsulating adhesive film 102, a thickness of the first encapsulating adhesive film 101 may range from 0.3 mm to 0.8 mm, and a thickness of each protrusion structure 105 may range from 0.05 mm to 0.15 mm. In one example, the gram weight of the first encapsulating adhesive film 101 may be 480 g/m². In the direction X from the first encapsulating adhesive film 101 to the second encapsulating adhesive film 102, the thickness of the first encapsulating adhesive film 101 may be 0.6 mm, and the thickness of the protrusion structure 105 may be 0.1 mm. In another example, the gram weight of the first encapsulating adhesive film 101 may be 380 g/m², and in the direction X, the thickness of the first encapsulating adhesive film 101 may be 0.41 mm, and the thickness of the protrusion structure 105 may be 0.1 mm.

In other embodiments, if the at least one protrusion structure 105 is disposed on the side of the second encapsulating adhesive film 102 away from the gap 103, in the direction X from the first encapsulating adhesive film 101 to the second encapsulating adhesive film 102, a ratio of a thickness of each protrusion structure 105 to a thickness of a part of the second encapsulating adhesive film 102 located in the peripheral region I may also be ⅓ to ⅐. Therefore, it is advantageous to control the overall mass of the protrusion structure 105 and the second encapsulating adhesive film 102 in an appropriate range while increasing the pressure applied on the cell string 100 by using the protrusion structure 105, so as to avoid unnecessary increase in the overall mass of the photovoltaic module.

In some embodiments, a gram weight of the second encapsulating adhesive film 102 may range from 300 g/m² to 550 g/m². In the direction X from the first encapsulating adhesive film 101 to the second encapsulating adhesive film 102, a thickness of the second encapsulating adhesive film 102 may range from 0.3 mm to 0.8 mm, and a thickness of the protrusion structure 105 may range from 0.05 mm to 0.15 mm. In one example, a gram weight of the second encapsulating adhesive film 102 may be 480 g/m². In the direction X, the thickness of the second encapsulating adhesive film 102 may be 0.6 mm, and the thickness of the protrusion structure 105 may be 0.1 mm. In another example, the gram weight of the second encapsulating adhesive film 102 may be 380 g/m², and in the direction X, the thickness of the second encapsulating adhesive film 102 may be 0.41 mm, and the thickness of the protrusion structure 105 may be 0.1 mm.

Figure 7:
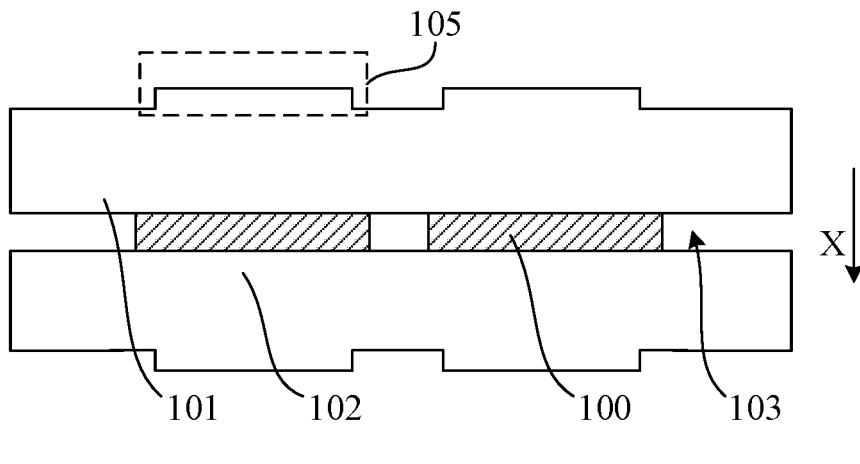

It can be understood that in practical situations, referring to FIG. 7, in the photovoltaic module, the first encapsulating adhesive film 101 may not define the first hole 111 and the second encapsulating adhesive film 102 may not define the second hole 112, and there is also no filling structure. For example, the first encapsulating adhesive film 101 and the second encapsulating adhesive film 102 each are only provided with the at least one protrusion structure 105. In FIG. 7, both the first encapsulating adhesive film 101 and the second encapsulating adhesive film 102 are provided with one or more protrusion structures 105. In practical situations, only one of the first encapsulating adhesive film 101 and the second encapsulating adhesive film 102 may be provided with one or more protrusion structures 105.

In some embodiments, referring to FIGS. 8 to 11, the photovoltaic module may further include at least one second protrusion block (also known as a protrusion block) 125 and at least one groove 135. The at least one second protrusion block 125 is disposed on a side of one of the first encapsulating adhesive film 101 and the second encapsulating adhesive film 102 located in the central region II close to the gap 103, and each second protrusion block 125 is disposed in a spacing between a corresponding pair of adjacent cell strings 100. The at least one groove 135 is defined on a side of the other of the first encapsulating adhesive film 101 and the second encapsulating adhesive film 102 in the central region II close to the gap 103. Each of the at least one second protrusion block 125 is filled in a corresponding groove 135.

In this way, the connection strength between the first encapsulating adhesive film 101 and the second encapsulating adhesive film 102 is further strengthened due to cooperation between the at least one second protrusion block 125 and the at least one groove 135. Moreover, each second protrusion block 125 is disposed in the spacing between the corresponding pair of the adjacent cell strings 100, which is beneficial to limit positions of the cell strings 100 and prevent the cell strings 100 from slipping due to being squeezed by the first encapsulating adhesive film 101 and the second encapsulating adhesive film 102 during the lamination, thereby further improving the yield and stability of the photovoltaic module.

In FIGS. 8 to 11, the first encapsulating adhesive film 101 is provided with the at least one second protrusion block 125 on the side near the gap 103, and the second encapsulating adhesive film 102 defines the at least one groove 135 on the side near the gap 103. Alternatively, the first encapsulating adhesive film 101 defines the at least one groove 135 on the side near the gap 103, and the second encapsulating adhesive film 102 is provided with the at least one second protrusion block 125 on the side near the gap 103.

In some embodiments, continuing to refer to FIGS. 8 to 11, in a direction Y perpendicular to the direction X from the first encapsulating adhesive film 101 to the second encapsulating adhesive film 102, a width of a region of each second protrusion block 125 close to a corresponding groove 135 is larger than a width of another region of the second protrusion block 125 away from the corresponding groove 135, and a width of a region of each groove 135 close to a corresponding pair of adjacent cell strings 100 is smaller than a width of another region of the groove 135 away from the corresponding pair of adjacent cell strings 100. In this way, with aid of the elasticity of the first encapsulating adhesive film 101 and the second encapsulating adhesive film 102, snap-in connection between the first encapsulating adhesive film 101 and the second encapsulating adhesive film 102 can be realized by applying a small pressure between the first encapsulating adhesive film 101 and the second encapsulating adhesive film 102, which is beneficial to further strengthen the connection strength between the first encapsulating adhesive film 101 and the second encapsulating adhesive film 102, so as to further improve the yield and stability of the photovoltaic module.

The shape of the second protrusion block 125 may be described in detail below in following two embodiments.

Figure 8:
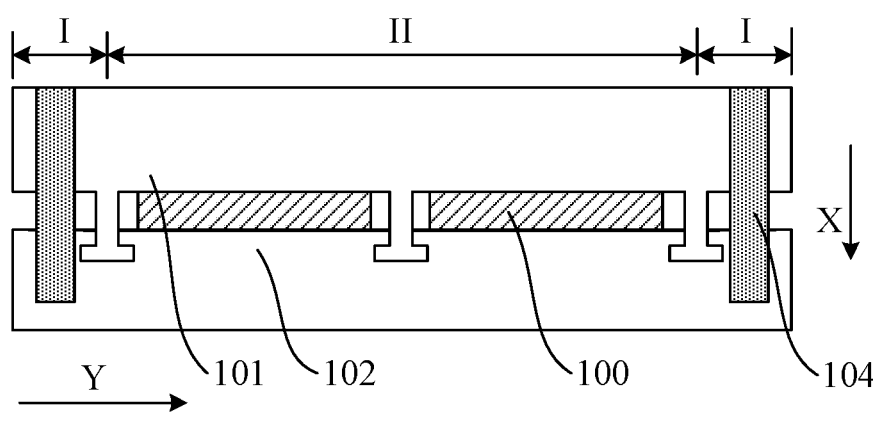
Figure 9:
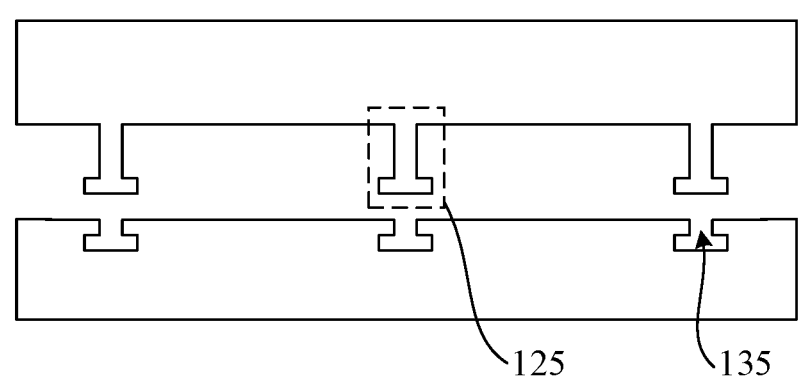
FIG. 9 is a schematic cross-sectional structural view of the first encapsulating adhesive film and the second encapsulating adhesive film in the photovoltaic module provided in FIG. 8.
Figure 10:
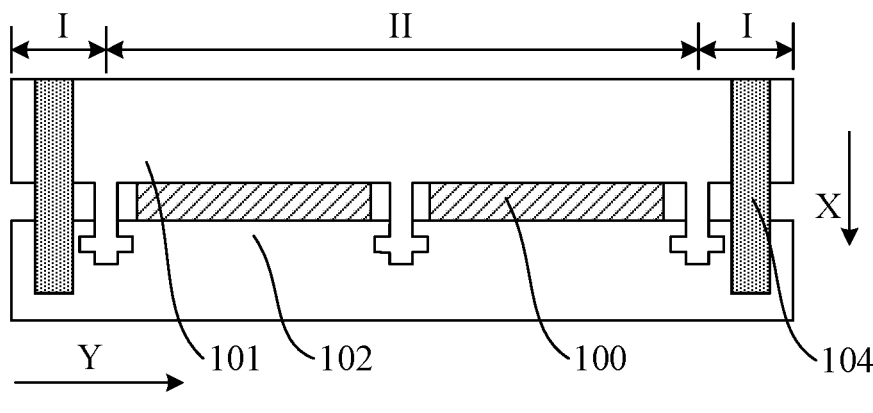

In some embodiments, referring to FIGS. 8 and 9, in the direction Y, a wider region of each second protrusion block 125 fits with a bottom of the corresponding groove 135, i.e., the second protrusion block 125 is substantially in a shape of "T". In other embodiments, referring to FIGS. 10 and 11, in the direction Y, a wider region of the second protrusion block 125 is located in a middle region of the second protrusion block 125, that is, the second protrusion block 125 has a cross shape as a whole.

In the above two embodiments, in the direction Y, a ratio of a width of the region of each second protrusion block 125 near the bottom of the corresponding groove 135 to a width of the another region of the second protrusion block 125 away from the bottom of the corresponding groove 135 may be 0.5 to 1. That is, a ratio of a maximum width to a minimum width of the second protrusion block 125 is 0.5 to 1. Furthermore, in the direction X, a ratio of a thickness of the wider region in the second protrusion block 125 to an overall thickness of the second protrusion block 125 may be 0.25 to 0.7.

In some embodiments, in the direction X, a difference between a thickness of each second protrusion block 125 and a depth of a corresponding groove 135 is not less than 0.13 mm, thus facilitating providing a sufficient space to accommodate the plurality of cell strings 100 and avoiding cracks or fragments caused by excessive pressure applied on the cell strings 100 during the lamination.

In some embodiments, referring to FIG. 4, in the direction X, each cell string 100 may have a thickness in a range of 0.13 mm to 0.16 mm, and thus, the difference between the thickness of each second protrusion block 125 and the depth of the corresponding groove 135 may not be greater than 0.16 mm.

In some embodiments, the at least one second protrusion block 125 and the first encapsulating adhesive film 101 or the second encapsulating adhesive film 102 are integrally formed, so that the connection strength between the second protrusion block 125 and the first encapsulating adhesive film 101 or the second encapsulating adhesive film 102 can be improved, and the relative slip between the second protrusion block 125 and the first encapsulating adhesive film 101 or the second encapsulating adhesive film 102 can be avoided. It is to be noted that in FIGS. 8 to 11, the second protrusion block 125 and the first encapsulating adhesive film 101 being integrally formed is taken as an example. In practical situations, if the second protrusion block 125 is disposed on the second encapsulating adhesive film 102, the second protrusion block 125 and the second encapsulating adhesive film 102 are integrally formed.

Figure 12:
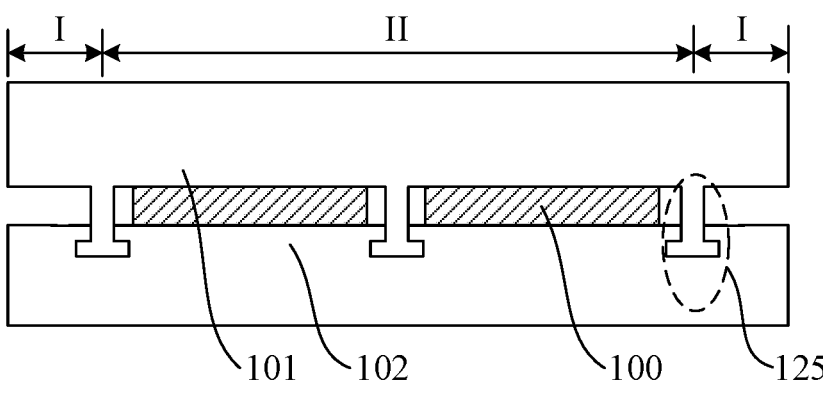

In some practical examples, referring to FIG. 12, in the photovoltaic module, the first encapsulating adhesive film 101 does not define at least one first hole 111 and the second encapsulating adhesive film 102 does not define at least one second hole 112, and correspondingly there is no filling structure. The photovoltaic module in FIG. 12 includes at least one second protrusion block 125 and at least one groove 135. The at least one second protrusion block 125 is disposed a side of one of the first encapsulating adhesive film 101 and the second encapsulating adhesive film 102 in the central area II close to the gap 103, and each second protrusion block 125 is located in the spacing between the corresponding pair of the adjacent cell strings 100. The least one groove 135 (referring to FIG. 9) is located on a side of the other of the first encapsulating adhesive film 101 and the second encapsulating adhesive film 102 in the central region II near the gap 103. Each second protrusion block 125 is filled in the corresponding groove 135.

Figure 13:
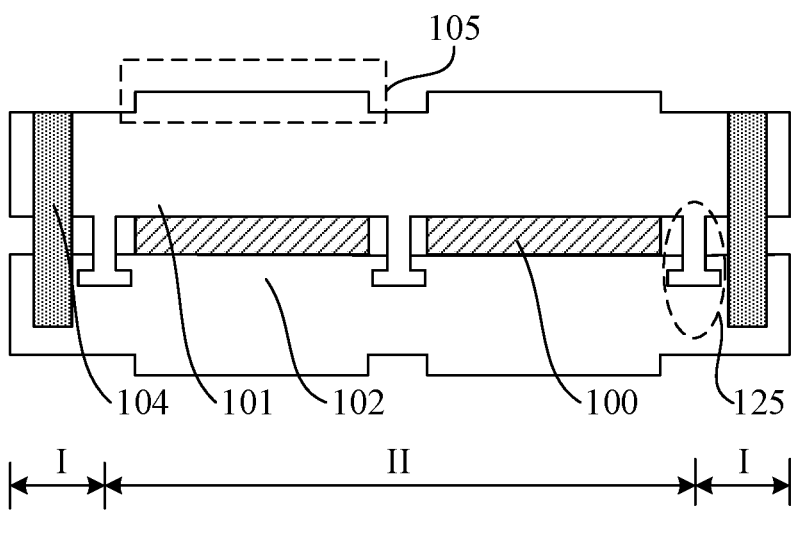

In other practical examples, referring to FIG. 13, the first encapsulating adhesive film 101 defines the at least one first hole 111 (referring to FIG. 3), the second encapsulating adhesive film 102 defines the at least one second hole 112 (referring to FIG. 3), and there is also at least one filling structure 104 in the photovoltaic module. In addition, one of the first encapsulating adhesive film 101 and the second encapsulating adhesive film 102 is provided with at least one second protrusion block 125, and the other of the first encapsulating adhesive film 101 and the second encapsulating adhesive film 102 defines at least one groove 135. Furthermore, at least one of the first encapsulating adhesive film 101 and the second encapsulating adhesive film 102 is also provided with at least one protrusion structure 105.

In other embodiments, there is no first hole defined on the first encapsulating adhesive film and there is no second hole defined on second encapsulating adhesive film, and there is also no filling structure in the photovoltaic module. However, one of the first encapsulating adhesive film and the second encapsulating adhesive film is provided with at least one second protrusion block, and the other of the first encapsulating adhesive film and the second encapsulating adhesive film defines at least one groove. Furthermore, at least one of the first encapsulating adhesive film and the second encapsulating adhesive film is provided with at least one protrusion structure.

In some embodiments, the photovoltaic module may further include at least one cover plate (not shown) for covering a surface of the first encapsulating adhesive film 101 facing away from the plurality of cell strings 100 and a surface of the second encapsulating adhesive film 102 facing away from the plurality of cell strings 100. The cover plate may be a transparent or translucent cover plate, such as a glass cover plate or a plastic cover plate.

In some embodiments, a light trapping structure may be provided on the cover plate to increase utilization of incident light, and different light trapping structures may be provided for different cover plates.

Therefore, during the lamination, before the first encapsulating adhesive film 101 and the second encapsulating adhesive film 102 are gradually solidified and shaped under the action of pressure, the filling structure 104 has been solidified and formed. In this way, it is possible to realize the positioning between the first encapsulating adhesive film 101 and the second encapsulating adhesive film 102 through the cooperation between the filling structure 104 and the first hole 111 and the second hole 112. On the other hand, it is advantageous to prevent the relative slip between the first encapsulating adhesive film 101 and the second encapsulating adhesive film 102 through the solidified filling structure 104, and further avoid slip of the plurality of cell strings 100 due to the relative slip between the first encapsulating adhesive film 101 and the second encapsulating adhesive film 102, thereby avoiding stacking of the cell strings and improving the yield and stability of photovoltaic modules. In addition, in subsequent use of photovoltaic modules, when the adhesion between the first encapsulating adhesive film and the second encapsulating adhesive film is not good, relative movement between the first encapsulating adhesive film 101 and the second encapsulating adhesive film 102 can be avoided with aid of the mating relationship between the filling structure 104 and the first hole 111 and the second hole 112, thereby further improving the stability and service life of the photovoltaic module.

Embodiments of the disclosure further provide a method for manufacturing a photovoltaic module, which is used for manufacturing the photovoltaic module provided in foregoing embodiments of the disclosure. The following may describe the method for manufacturing a photovoltaic module provided in embodiments of the disclosure in detail below in combination with the accompanying drawings. For same parts as the foregoing embodiments, reference may be made to related portions of the foregoing embodiments, which are not described herein. FIGS. 14 to 19 are schematic views of structures corresponding to steps of the method for manufacturing the photovoltaic module according to embodiments of the disclosure.

Referring to FIGS. 14 to 19, the method for manufacturing a photovoltaic module includes the following. A plurality of cell strings 100 are provided. A first encapsulating adhesive film 101 provided in foregoing embodiments is formed, where the first encapsulating adhesive film 101 is disposed on a side of each of the plurality of cell strings 100. A second encapsulating adhesive film 102 provided in foregoing embodiments is formed, where the second encapsulating adhesive film 102 is disposed on the other side of each of the plurality of cell strings 100 away from the first encapsulating adhesive film 101. At least one first hole 111 is defined on the first encapsulating adhesive film 101 in a peripheral region I, and at least one second hole 112 is defined on the second encapsulating adhesive film 102 in the peripheral region I.

Figure 14:
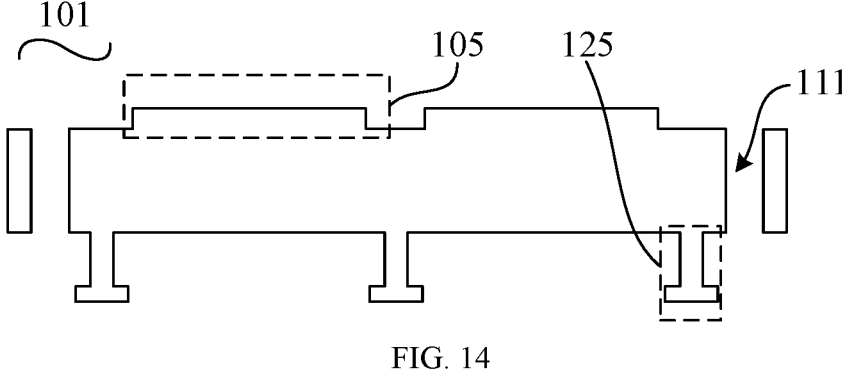
FIGS. 14 to 19 are schematic views of structures corresponding to steps of the method for manufacturing the photovoltaic module according to embodiments of the disclosure.
Figure 15:
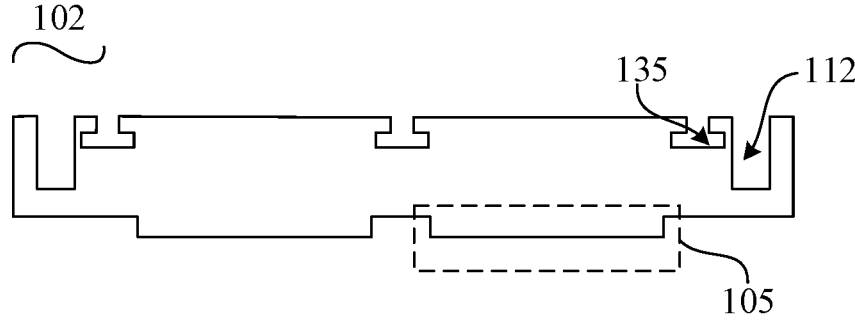

FIG. 14 is a cross-sectional schematic view of the first encapsulating adhesive film 101 of the photovoltaic module provided in FIG. 13, and FIG. 15 is a cross-sectional schematic view of the second encapsulating adhesive film 102 of the photovoltaic module provided in FIG. 13. The following may describe the method for manufacturing the photovoltaic module provided in FIG. 13 as an example of the method for manufacturing the photovoltaic module provided in embodiments of the disclosure. In practical situations, the method for manufacturing the photovoltaic module provided in embodiments of the disclosure can be used for manufacturing various photovoltaic modules included in the foregoing embodiments.

In some embodiments, the first encapsulating adhesive film 101 and the second encapsulating adhesive film 102 are formed as follows.

Figure 16:
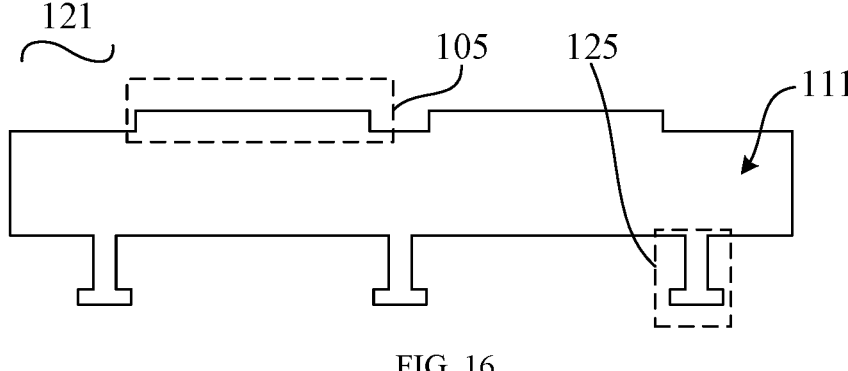
Figure 17:
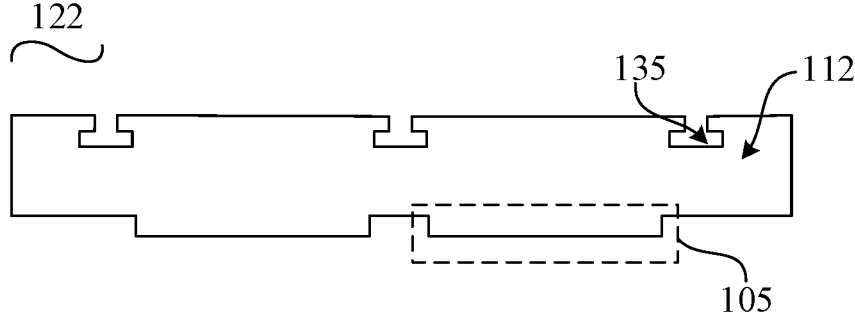

Referring to FIGS. 16 and 17, an initial first encapsulating adhesive film 121 and an initial second encapsulating adhesive film 122 are provided, where there is a gap 103 between the initial first encapsulating adhesive film 121 and the initial second encapsulating adhesive film 122 for accommodating the plurality of cell strings 100.

The initial first encapsulating adhesive film 121 and the initial second encapsulating adhesive film 122 may be formed by a roller pressure molding process.

Specific configurations of the initial first encapsulating adhesive film 121 and the initial second encapsulating adhesive film 122 may be described in detail below in following two embodiments.

In some embodiments, continuing to refer to FIGS. 16 and 17, each of at least one of a side of the initial first encapsulating adhesive film 121 away from the gap 103 and a side of the initial second encapsulating adhesive film 122 away from the gap 103 is provided with at least one protrusion structure 105. An orthographic projection of each protrusion structure 105 on the initial first encapsulating adhesive film 121 is located in an orthographic projection of a portion of the gap 103, for accommodating a corresponding cell string 100, on the initial first encapsulating adhesive film 121, or an orthographic projection of each protrusion structure 105 on the initial second encapsulating adhesive film 122 is located in an orthographic projection of a portion of the gap 103, for accommodating a corresponding cell string 100, on the initial second encapsulating adhesive film 122. It is to be noted that in FIGS. 16 and 17, both the side of the initial first encapsulating adhesive film 121 away from the gap 103 and the side of the initial second encapsulating adhesive film 122 away from the gap 103 are provided with protrusion structures 105. In practical situations, only the side of the initial first encapsulating adhesive film 121 away from the gap 103 or the initial second encapsulating adhesive film 122 away from the gap 103 may be provided with the at least one protrusion structure 105.

In addition, one of the initial first encapsulating adhesive film 121 and the initial second encapsulating adhesive film 122 is further provided with at least one second protrusion block 125 on a side of the one of the initial first encapsulating adhesive film 121 and the initial second encapsulating adhesive film 122 in the central area II close to the gap 103, and each second protrusion block 125 is located in a spacing between a corresponding pair of adjacent cell strings 100. The other of the initial first encapsulating adhesive film 121 and the initial second encapsulating adhesive film 122 further defines at least one groove 135 on the other of the initial first encapsulating adhesive film 121 and the initial second encapsulating adhesive film 122 in the central area II close to the gap 103. Each second protrusion block 125 is filled in a corresponding groove 135. In FIGS. 16 and 17, the initial first encapsulating adhesive film 121 is provided with the at least one second protrusion block 125 on the side near the gap 103 and the initial second encapsulating adhesive film 122 defines at least one groove 135 on the side near the gap 103. In practical situations, the initial first encapsulating adhesive film 121 defines at least one groove 135 on the side near the gap 103 and the initial second encapsulating adhesive film 122 is provided with at least one second protrusion block 125 on the side near the gap 103. Alternatively, the side of the initial first encapsulating adhesive film 121 close to the gap 103 may be provided with at least one second protrusion block 125 and define at least one groove 135, the at least one second protrusion block 125 and the at least one groove 135 are alternately arranged, and the side of the initial second encapsulating adhesive film 122 close to the gap 103 may define at least one groove 135 and be provided with at least one second protrusion block 125, the at least one second protrusion block 125 and the at least one groove 135 are alternately arranged. Each second protrusion block 125 in the initial first encapsulating adhesive film 121 directly faces a corresponding groove 135 in the initial second encapsulating adhesive film 122, and each groove 135 in the initial first encapsulating adhesive film 121 directly faces a corresponding second protrusion block 125 in the initial second encapsulating adhesive film 122.

In some embodiments, at least one of the side of the initial first encapsulating adhesive film 121 away from the gap 103 and the side of the initial second encapsulating adhesive film 122 away from the gap 103 is provided with at least one protrusion structure 105. An orthographic projection of each protrusion structure 105 on the initial first encapsulating adhesive film 121 is located in an orthographic projection of a corresponding cell string 100 on the initial first encapsulating adhesive film 121, or an orthographic projection of each protrusion structure 105 on the initial second encapsulating adhesive film 122 is located in an orthographic projection of the corresponding cell string 100 on the initial second encapsulating adhesive film 122. In addition, there is no second protrusion block and no groove corresponding to the second protrusion block on the initial first encapsulating adhesive film 121 and the initial second encapsulating adhesive film 122.

In some embodiments, one of the initial first encapsulating adhesive film 121 and the initial second encapsulating adhesive film 122 is provided with at least one second protrusion block 125 on a side of the one of the initial first encapsulating adhesive film 121 and the initial second encapsulating adhesive film 122 in the central area II close to the gap 103, and each second protrusion block 125 is located in a spacing between a corresponding pair of adjacent cell strings 100. The other of the initial first encapsulating adhesive film 121 and the initial second encapsulating adhesive film 122 defines at least one groove 135 on the other of the initial first encapsulating adhesive film 121 and the initial second encapsulating adhesive film 122 in the central area II close to the gap 103. Each second protrusion block 125 is filled in a corresponding groove 135. In addition, neither the initial first encapsulating adhesive film 121 nor the initial second encapsulating adhesive film 122 is provided with at least one protrusion structure.

Figure 18:
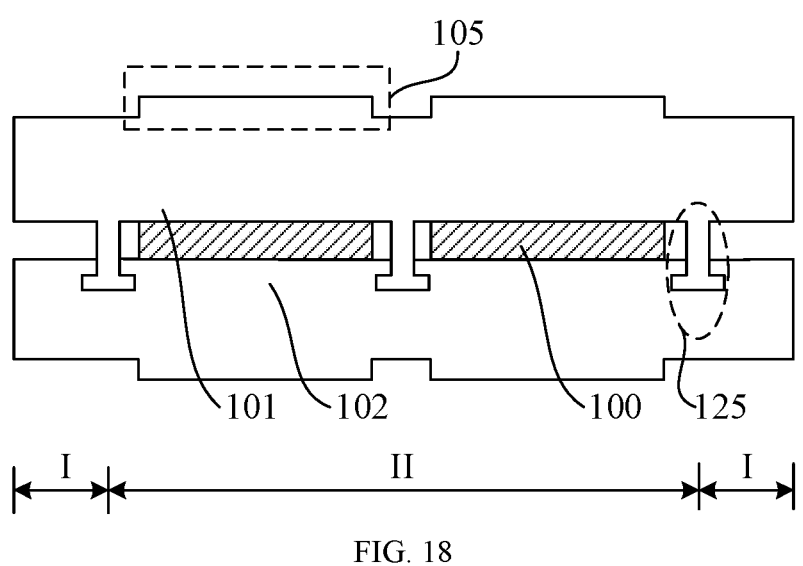

Referring to FIG. 18, after the initial first encapsulating adhesive film 121 and the initial second encapsulating adhesive film 122 are provided, the initial first encapsulating adhesive film 121 is placed on a side of each of the plurality of cell strings 100, and the initial second encapsulating adhesive film 122 is placed on the other side of each of the plurality of cell strings 100 away from the initial first encapsulating adhesive film 121.

Figure 19:
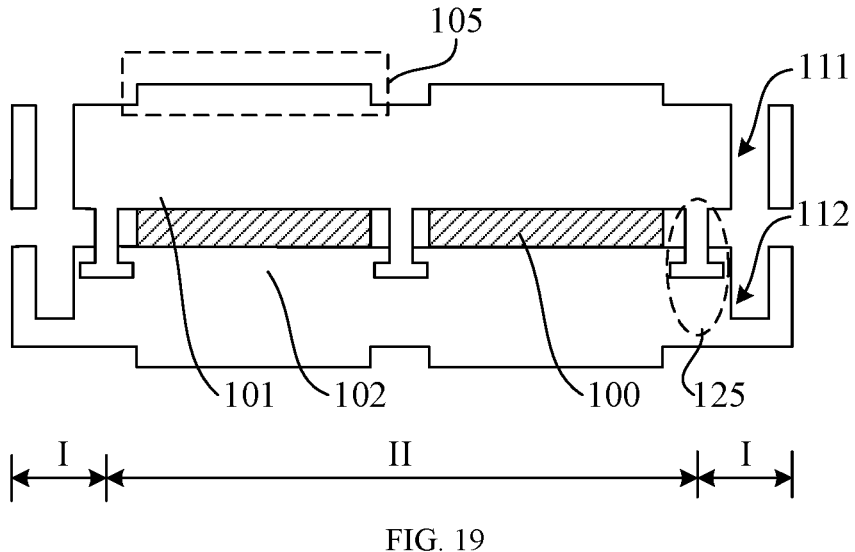

Referring to FIG. 19, at least one hole is punched on the initial first encapsulating adhesive film 121 in the peripheral region I to define at least one first hole 111, and at least one hole is punched on the initial second encapsulating adhesive film 122 in the peripheral region I to define at least one second hole 112.

With reference to FIGS. 19 and 13, after the first encapsulating adhesive film 101 and the second encapsulating adhesive film 102 are formed, the method for manufacturing the photovoltaic module further includes the following. The plurality of cell strings 100, the first encapsulating adhesive film 101, and the second encapsulating adhesive film 102 are encapsulated, and at least one filling structure 104 is provided during encapsulating. Each filling structure 104 is filled in a corresponding first hole 111 and a corresponding second hole 112. A crosslinking curing speed of a material in each filling structure 104 is faster than a crosslinking curing speed of a material in the first encapsulating adhesive film 101, and the crosslinking curing speed of the material in the filling structure 104 is also faster than a crosslinking curing speed of a material in the second encapsulating adhesive film 102.

Therefore, during the encapsulating, before the first encapsulating adhesive film 101 and the second encapsulating adhesive film 102 are gradually solidified and shaped under the action of pressure, the filling structure 104 has been solidified and formed. On one hand, it is beneficial to realize positioning between the first encapsulating adhesive film 101 and the second encapsulating adhesive film 102 through cooperation between the filling structure 104 and the first through-hole 111 and the second through-hole 112.

On the other hand, it is advantageous to avoid relative slip between the first encapsulating adhesive film 101 and the second encapsulating adhesive film 102 through the solidified filling structure 104, and further avoid slip of the cell strings 100 due to the relative slip between the first encapsulating adhesive film 101 and the second encapsulating adhesive film 102, thereby avoiding stacking of cell strings and improving the yield and stability of the photovoltaic modules.

It is to be noted that the term "and/or" used in the specification and appended claims of the disclosure refers to any combination of one or more of associated items listed and all possible combinations, and includes these combinations.

In addition, the terms "first", "second", "third", and "fourth" and the like used in the specification, the claims, and the accompany drawings of the disclosure are used to distinguish different objects rather than describe a particular order. The terms "include", "comprise", and "have" as well as variations thereof are intended to cover non-exclusive inclusion.

Those skilled in the art should appreciate that the embodiments are specific embodiments for implementing the disclosure. In practice, however, various changes may be made in the forms and details of the specific embodiments without departing from the spirit and scope of the disclosure. Any person skilled in the art may make their own changes and modifications without departing from the scope of the disclosure, so the protection scope of the present disclosure shall be subject to the scope defined by the claims.

What is claimed is:

1. A photovoltaic module, comprising:
   a plurality of cell strings; and
   a first encapsulating adhesive film and a second encapsulating adhesive film that are stacked, wherein a gap between the first encapsulating adhesive film and the second encapsulating adhesive film accommodates the plurality of cell strings;
   wherein each of at least one of the first encapsulating adhesive film and the second encapsulating adhesive film has at least one protrusion structure on a side facing away from the gap, wherein a first orthographic projection of a protrusion structure on one of the first encapsulating adhesive film and the second encapsulating adhesive film is located in a second orthographic projection of a corresponding cell string on the one of the first encapsulating adhesive film and the second encapsulating adhesive film,
   the photovoltaic module has a central region and a peripheral region surrounding the central region, wherein
   the photovoltaic module further comprises at least one protrusion block, wherein the at least one protrusion block is disposed on a side of one of the first encapsulating adhesive film and the second encapsulating adhesive film in the central region close to the gap, and each protrusion block is disposed in a spacing between a corresponding pair of adjacent cell strings; and
   the photovoltaic module further defines at least one groove, wherein the at least one groove is defined on a side of another of the first encapsulating adhesive film and the second encapsulating adhesive film in the central region close to the gap, and each protrusion block is filled in a corresponding groove,
   in a direction perpendicular to a direction from the first encapsulating adhesive film to the second encapsulating adhesive film, a width of a region of a respective protrusion block close to a corresponding groove is larger than a width of another region of the respective protrusion block away from the corresponding groove;

a width of a region of a respective groove close to a corresponding pair of adjacent cell strings is smaller than a width of another region of the respective groove away from the corresponding pair of the adjacent cell strings, and a wider region of the respective protrusion block fits with a bottom of the corresponding groove, and the respective protrusion block is substantially T-shaped.

2. The photovoltaic module of claim 1, wherein a ratio of an area of the first orthographic projection to an area of the second orthographic projection is 0.5 to 1.

3. The photovoltaic module of claim 2, wherein in a direction from the first encapsulating adhesive film to the second encapsulating adhesive film, a ratio of a thickness of each protrusion structure to a thickness of the first encapsulating adhesive film in the peripheral region is 1/3 to 1/7.

4. The photovoltaic module of claim 1, wherein each protrusion structure comprises a plurality of first protrusion blocks spaced apart from each other, and the plurality of first protrusion blocks are arranged in an extending direction of each of the plurality of cell strings.

5. The photovoltaic module of claim 1, wherein each protrusion structure comprises a plurality of first protrusion blocks spaced apart from each other, and the plurality of first protrusion blocks are arranged in an array.

6. The photovoltaic module of claim 1, wherein a thickness of each protrusion structure ranges from 0.05 mm to 0.15 mm, in a direction from the first encapsulating adhesive film to the second encapsulating adhesive film.

7. The photovoltaic module of claim 1, wherein the at least one protrusion structure and the first encapsulating adhesive film are integrally formed or the at least one protrusion structure and the second encapsulating adhesive film are integrally formed.

8. The photovoltaic module of claim 1, wherein in the direction perpendicular to the direction from the first encapsulating adhesive film to the second encapsulating adhesive film, a ratio of the width of the region of the respective protrusion block close to a bottom of the corresponding groove to the width of the another region of the respective protrusion block away from the bottom of the corresponding groove is 0.5 to 1.

9. The photovoltaic module of claim 1, wherein the direction from the first encapsulating adhesive film to the second encapsulating adhesive film, a ratio of a thickness of a wider region in the respective protrusion block to an overall thickness of the respective protrusion block ranges from 0.25 to 0.7.

10. The photovoltaic module of claim 1, wherein the wider region of the respective protrusion block is located in a middle region of the respective protrusion block, and the respective protrusion block has a cross shape as a whole.

11. The photovoltaic module of claim 1, wherein in a direction from the first encapsulating adhesive film to the second encapsulating adhesive film, a difference between a thickness of each protrusion block and a depth of the corresponding groove is not less than 0.13 mm.

12. The photovoltaic module of claim 1, wherein in a direction from the first encapsulating adhesive film to the second encapsulating adhesive film, a difference between a thickness of each protrusion block and a depth of the corresponding groove is not greater than 0.16 mm.

13. The photovoltaic module of claim 1, wherein the at least one protrusion block and the first encapsulating adhesive film or the second encapsulating adhesive film are integrally formed.

14. The photovoltaic module of claim 1, wherein the plurality of cell strings are disposed in the central region, wherein the first encapsulating adhesive film has at least one first hole in the peripheral region, the second encapsulating adhesive film has at least one second hole in the peripheral region, and each first hole of the at least one first hole is aligned with a corresponding second hole of the at least one second hole, wherein the at least one first hole and the at least one second hole include one or more through holes; and at least one filling structure, wherein each filling structure of the at least one filling structure fills a respective first hole and a respective second hole, wherein the at least one filling structure includes a material having a crosslinking curing speed that is faster than a crosslinking curing speed of a material in the first encapsulating adhesive film and is faster than a crosslinking curing speed of a material in the second encapsulating adhesive film.

15. The photovoltaic module of claim 14, wherein in a direction from the first encapsulating adhesive film to the second encapsulating adhesive film, a ratio of a thickness of the each filling structure to a sum of a depth of the respective first hole and a depth of the respective second hole is 1:0.8 to 1:1.2.

* * * * *